(12) United States Patent
Hara et al.

(10) Patent No.: US 8,940,380 B2
(45) Date of Patent: Jan. 27, 2015

(54) COATING LIQUID FOR FORMING INSULATION FILM, INSULATION FILM USING THE SAME, AND METHOD FOR PRODUCING COMPOUND USED IN THE SAME

(75) Inventors: Kenji Hara, Tokyo (JP); Atsushi Kobayashi, Tokyo (JP); Hiroo Yokota, Tokyo (JP); Hiroshi Morita, Tokyo (JP); Seiichi Saito, Tokyo (JP)

(73) Assignee: Adeka Corporation, Tokyo (JP)

( * ) Notice: Subject to any disclaimer, the term of this patent is extended or adjusted under 35 U.S.C. 154(b) by 391 days.

(21) Appl. No.: 13/500,095

(22) PCT Filed: Oct. 1, 2010

(86) PCT No.: PCT/JP2010/067247
§ 371 (c)(1),
(2), (4) Date: Apr. 4, 2012

(87) PCT Pub. No.: WO2011/043264
PCT Pub. Date: Apr. 14, 2011

(65) Prior Publication Data
US 2012/0192761 A1 Aug. 2, 2012

(30) Foreign Application Priority Data
Oct. 5, 2009 (JP) ................... 2009-231970

(51) Int. Cl.
| | | |
|---|---|---|
| C08G 77/62 | (2006.01) | |
| C09D 183/16 | (2006.01) | |
| C08L 83/16 | (2006.01) | |
| C08G 77/12 | (2006.01) | |
| H01L 21/02 | (2006.01) | |
| C09D 1/00 | (2006.01) | |
| H01B 3/02 | (2006.01) | |

(52) U.S. Cl.
CPC ............... *C08G 77/62* (2013.01); *C08G 77/12* (2013.01); *C08L 83/16* (2013.01); *C09D 183/16* (2013.01); *H01L 21/02164* (2013.01); *H01L 21/02222* (2013.01); *H01L 21/02282* (2013.01); *C09D 1/00* (2013.01); *H01B 3/02* (2013.01)
USPC ........................................... 428/99; 423/324

(58) Field of Classification Search
CPC .... H01L 2/02164; C08G 77/62; C01B 33/00; C08L 83/16; C09D 183/16
USPC ........................................... 438/99; 423/324
See application file for complete search history.

(56) References Cited

U.S. PATENT DOCUMENTS

| | | | |
|---|---|---|---|
| 4,397,828 A | | 8/1983 | Seyferth et al. |
| 4,840,778 A | | 6/1989 | Arai et al. |
| 4,861,569 A | | 8/1989 | Funayama et al. |
| 4,933,160 A | | 6/1990 | Funayama et al. |
| 5,294,425 A | * | 3/1994 | Schwab ................ 423/324 |
| 5,885,654 A | | 3/1999 | Hagiwara et al. |
| 6,767,641 B1 | | 7/2004 | Shimizu et al. |
| 2010/0112749 A1 | | 5/2010 | Park et al. |

FOREIGN PATENT DOCUMENTS

| | | |
|---|---|---|
| JP | 59-207812 A | 11/1984 |
| JP | 63-16325 A | 4/1988 |
| JP | 1-138108 A | 5/1989 |
| JP | 1-203476 A | 8/1989 |
| JP | 5-311120 A | 11/1993 |
| JP | H06-136131 A | 5/1994 |
| JP | 7-223867 A | 8/1995 |
| JP | H08-269399 A | 10/1996 |
| JP | 10-062638 A | 3/1998 |
| JP | 10-140087 A | 5/1998 |
| JP | H10-194753 A | 7/1998 |
| JP | H11-116815 A | 4/1999 |
| JP | 2001-308090 A | 11/2001 |
| JP | 2010-111842 A | 5/2010 |
| JP | 2011-79917 A | 4/2011 |

OTHER PUBLICATIONS

Hashimoto, "Characteristics and Applications of SiO2 Films Using Polysilazane," Electronic Materials, Kogyo Chosakai Publishing Co., Ltd., Dec. 1994, pp. 50-55.
International Search Report dated Jan. 18, 2011 for International Application No. PCT/JP2010/067247 (Form PCT/ISA/210).
Isoda et al., "Perhydropolysilazane Precursors to Silicon Nitride Ceramics", Journal of Inorganic and Organometallic Polymers, vol. 2, No. 1 (1992) pp. 151-160.
Japanese Office Action issued in Japanese Patent Application No. 2009-231970 on May 7, 2014.

\* cited by examiner

*Primary Examiner* — David M Brunsman
(74) *Attorney, Agent, or Firm* — Birch, Stewart, Kolasch & Birch, LLP

(57) ABSTRACT

The present invention provides a coating liquid for forming an insulation film, which has a small shrinkage in the calcination step in water vapor and is not likely to cause cracking of a resulting silica coating film or detachment thereof from a semiconductor substrate; an insulation film using the same; and a method of producing a compound used in the same. The coating liquid of comprises an inorganic polysilazane whose ratio of a peak area at 4.5 to 5.3 ppm attributed to $SiH_1$ group and $SiH_2$ group with respect to a peak area at 4.3 to 4.5 ppm attributed to $SiH_3$ group in $^1$H-NMR spectrum is 4.2 to 50; and an organic solvent. The insulation film is obtained using the coating liquid.

10 Claims, 2 Drawing Sheets

COATING LIQUID FOR FORMING INSULATION FILM, INSULATION FILM USING THE SAME, AND METHOD FOR PRODUCING COMPOUND USED IN THE SAME

TECHNICAL FIELD

The present invention relates to a coating liquid for forming an insulation film which constitutes an element isolation region or wiring interlayer insulation film of a semiconductor substrate; an insulation film using the same; and a method of producing a compound used in the same. More particularly, the present invention relates to a coating liquid for forming an insulation film which has a small shrinkage in the calcination step in water vapor and is not likely to cause cracking of a resulting silica coating film or detachment thereof from a semiconductor substrate; an insulation film using the same; and a method of producing a compound used in the same.

BACKGROUND ART

Silica coating films are widely used as an insulation film of a semiconductor device since they have excellent insulation properties, heat resistance, abrasion resistance and corrosion resistance. Along with miniaturization of semiconductor devices, there is a demand for an insulation film material for filling narrow gaps. An insulation film used in a semiconductor device is formed by, for example, a CVD (Chemical Vapor Deposition) method or a coating method. Although a CVD method yields a good-quality film, it has a drawback in the running cost since the productivity is low and the method requires a special chemical vapor deposition device. Meanwhile, since a coating method is excellent in terms of the cost and productivity, a variety of materials have been considered in order to improve the quality of the resulting film.

There among, polysilazane are macromolecular compounds having a Si—N bond (also referred to as silazane bond) as a base unit and known as a material with which a good-quality silica-based insulation film can be formed even in a narrow gap by a relatively inexpensive method, coating method. Examples of a method of preparing an insulation film using polysilazane include those methods which comprise: (1) the coating step in which a solution of polysilazane, such as xylene or dibutyl ether solution, is coated on a semiconductor substrate or the like by spin coating or the like; (2) the drying step in which a solvent is evaporated by heating the semiconductor substrate coated with polysilazane to about 150° C.; and (3) the calcination step in which this semiconductor substrate or the like is calcinated in water vapor at about 230 to 900° C. (for example, see Patent Documents 1 and 2).

Further, a polysilazane which does not contain an organic group in the molecule (hereinafter, also referred to as "inorganic polysilazane") is not a linear polymer constituted by a repeating base unit represented by —(SiH$_2$—NH)—, but is a mixture of polymers having a variety of structures containing a chain part and cyclic part. It is known that the silicon atom in such an inorganic polysilazane molecule is bound with 1 to 3 hydrogen atoms, and there are also known prior arts focusing on the ratio of the SiH$_1$ group, SiH$_2$ group and SiH$_3$ group in an inorganic polysilazane.

For example, in Patent Document 3, it is disclosed that a coating film having excellent heat resistance, abrasion resistance and chemical resistance as well as a high surface hardness can be obtained by using a polysilazane which has a SiH$_2$ group ratio with respect to SiH$_3$ group in one molecule of 2.5 to 8.4 and an element ratio of Si:N:H=50 to 70% by mass:20 to 34% by mass:5 to 9% by mass; and that the coating film can be suitably used as a binder for ceramic molded articles, particularly ceramic mold-sintered articles.

Further, Patent Document 4 discloses that a protective film having excellent mechanical strength and chemical stability is formed by coating a composition for forming a protective film of UV-shielding glass on a UV-shielding layer provided on a glass surface and heating the resultant in dry air, the composition comprising, as an indispensable component, a polysilazane which has a SiH$_3$ group ratio of 0.13 to 0.45 with respect to the sum of SiH$_1$ group, SiH$_2$ group and SiH$_3$ group in terms of the peak area ratio of $^1$H-NMR spectrum and a number average molecular weight of 200 to 100,000.

In addition, Patent Document 5 discloses that a coating liquid for forming an interlayer insulation film, which is composed of an inert organic solvent solution of a polysilazane adjusted to have, in terms of the peak area ratio of $^1$H-NMR spectrum, a SiH$_3$ group ratio of 0.15 to 0.45 with respect to the sum of SiH$_1$ group and SiH$_2$ group, has excellent storage stability and coating property as well as high insulation properties; and that this coating liquid can form a fine coating film having excellent surface profile with good reproducibility. Further, it is disclosed that the adjustment can be made by substituting some of the active hydrogens of polysilazane with a trimethylsilyl group, and hexamethyldisilazane is exemplified as an adjusting agent.

RELATED ART DOCUMENTS

Patent Documents

Patent Document 1: Japanese Unexamined Patent Application Publication No. H7-223867
Patent Document 2: Japanese Unexamined Patent Application Publication No. 2001-308090
Patent Document 3: Japanese Unexamined Patent Application Publication No. H1-138108
Patent Document 4: Japanese Unexamined Patent Application Publication No. H5-311120
Patent Document 5: Japanese Unexamined Patent Application Publication No. H10-140087

Non-Patent Document

Non-patent Document 1: "Electronic Materials" published by Kogyo Chosakai Publishing Co., Ltd., December, 1994, p. 50

SUMMARY OF THE INVENTION

Problems to be Solved by the Invention

However, as described in Patent Documents 1 and 2, when a semiconductor substrate or the like is calcinated in water vapor at a temperature of about 230 to 900° C., polysilazane reacts with water to generate ammonia and become oxidized to silica (silicon dioxide). In the formation of a silica insulation film using a polysilazane, shrinkage occurs in the process where a polysilazane coating film changes to a silica coating film. In order to improve the reactivity of a polysilazane to become silica, as well as to reduce the silanol group (Si—OH) on the silica surface and improve the insulation properties, it is preferred that the calcination step in water vapor be carried out at a higher temperature; however, high-temperature calcination results in an increase in such shrinkage as well. In cases where the shrinkage rate in the calcination step in water vapor is high, cracking of the silica coating film or detachment of the silica coating film from the semiconductor substrate may occur. In particular, in cases where a polysilazane is used in an element isolation application to fill narrow gaps between the semiconductor device elements and calcination is performed at a high temperature, there is a problem in that cracking and detachment of the resulting film are likely to occur. In the future, along with the demand for a semiconductor device in which the gaps between semiconductor elements are further narrowed, it is also demanded to further improve the performance of a polysilazane used in such semiconductor device.

In addition, in the method according to Patent Document 3, there is a problem in that the polysilazane contains a large amount of $SiH_3$ group, so that the shrinkage in the calcination step in water vapor is large and cracking becomes likely to occur when the resulting silica insulation film is calcinated at a temperature of not lower than 500° C. Further, the technique according to Patent Document 4 has a problem in that, since a glass protection film and insulating coating film require totally different physical properties and oxidation of the polysilazane is insufficient when heated in dry air, a coating film having insulation properties that are high enough to be used as an insulation coating film of a semiconductor device or the like cannot be formed. Moreover, the technique according to Patent Document 5 also has a problem in that the polysilazane reacted with hexamethyldisilazane has a large shrinkage in the calcination step in water vapor, so that cracking becomes likely to occur when the resulting silica insulation film is calcinated at a temperature of not lower than 500° C.

It is noted here that, in the calcination step in water vapor, the reaction of an inorganic polysilazane into silica is believed to proceed in accordance with the following reaction formulae (1) and (2) (for example, see Non-patent Document 1):

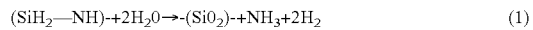
$$(SiH_2-NH)-+2H_2O \rightarrow -(SiO_2)-+NH_3+2H_2 \quad (1)$$

$$-(SiH_2-NH)-+2O_2 \rightarrow -(SiO_2)-+NH_3 \quad (2)$$

Therefore, an object of the present invention is to provide a coating liquid for forming an insulation film, which has a small shrinkage in the calcination step in water vapor and is not likely to cause cracking of a resulting silica coating film or detachment thereof from a semiconductor substrate; an insulation film using the same; and a method of producing a compound used in the same.

Means for Solving the Problems

With an assumption that shrinkage occurs and cracking and detachment are caused by that the $SiH_3$ group of an inorganic polysilazane does not contribute to the formation of a silica film since it is reduced by the hydrogen generated in the above-described reaction formula (1) to form silane (also referred to as $SiH_4$ or monosilane) and this highly volatile silane is vaporized from the resulting coating film, the present inventors intensively studied paying attention to the microstructure of an inorganic polysilazane, particularly $SiH_3$ group, to discover that the above-described problems can be solved by allowing a coating liquid for forming an insulation film to have the composition described below, thereby completing the present invention.

That is, the coating liquid for forming an insulation film according to the present invention is characterized by comprising an inorganic polysilazane whose ratio of a peak area at 4.5 to 5.3 ppm attributed to $SiH_1$ group and $SiH_2$ group with respect to a peak area at 4.3 to 4.5 ppm attributed to $SiH_3$ group in $^1H$-NMR spectrum is 4.2 to 50; and an organic solvent.

In the coating liquid for forming an insulation film according to the present invention, it is preferred that the above-described inorganic polysilazane have a mass average molecular weight of 2,000 to 20,000 and that the ratio of a component having a mass average molecular weight of not higher than 800 in the above-described inorganic polysilazane be not higher than 20%. Further, it is preferred that the above-described inorganic polysilazane have, in an infrared spectrum, a ratio of the maximum absorbance in the range of 3,300 to 3,450 $cm^{-1}$ of 0.01 to 0.15 with respect to the maximum absorbance in the range of 2,050 to 2,400 $cm^{-1}$. Still further, in the above-described inorganic polysilazane, it is preferred that the refractive index at a wavelength of 633 nm be 1.550 to 1.650.

In addition, in the coating liquid for forming an insulation film according to the present invention, it is preferred that the above-described inorganic polysilazane be one which is obtained by reacting a dihalosilane compound, a trihalosilane compound or a mixture thereof with a base to form an adduct and then reacting the resulting adduct with ammonia. Further, it is preferred that the total content of alcohol compound, aldehyde compound, ketone compound, carboxylic acid compound and ester compound in the above-described organic solvent be not higher than 0.1% by mass. Still further, it is preferred that the content of the above-described inorganic polysilazane be 5 to 40% by mass.

The insulation film according to the present invention is characterized by being obtained from the coating liquid for forming an insulation film according to the present invention. In the present invention, the insulation film is preferably one which is obtained through calcination at a temperature of not lower than 500° C.

The method of producing an inorganic polysilazane according to the present invention is characterized in that, in a method of producing an inorganic polysilazane in which an adduct is formed by reacting a dihalosilane compound, a trihalosilane compound or a mixture thereof with a base and the resulting adduct is then reacted with ammonia, ammonia is allowed to react in a solution or dispersion of above-described adduct at a temperature of −50 to −1° C.

Effects of the Invention

According to the present invention, a coating liquid for forming an insulation film, which has a small shrinkage in the calcination step in water vapor and is not likely to cause cracking of a resulting silica coating film or detachment thereof from a semiconductor substrate; an insulation film using the same; and a method of producing a compound used in the same can be provided.

MODE FOR CARRYING OUT THE INVENTION

Figure 1:
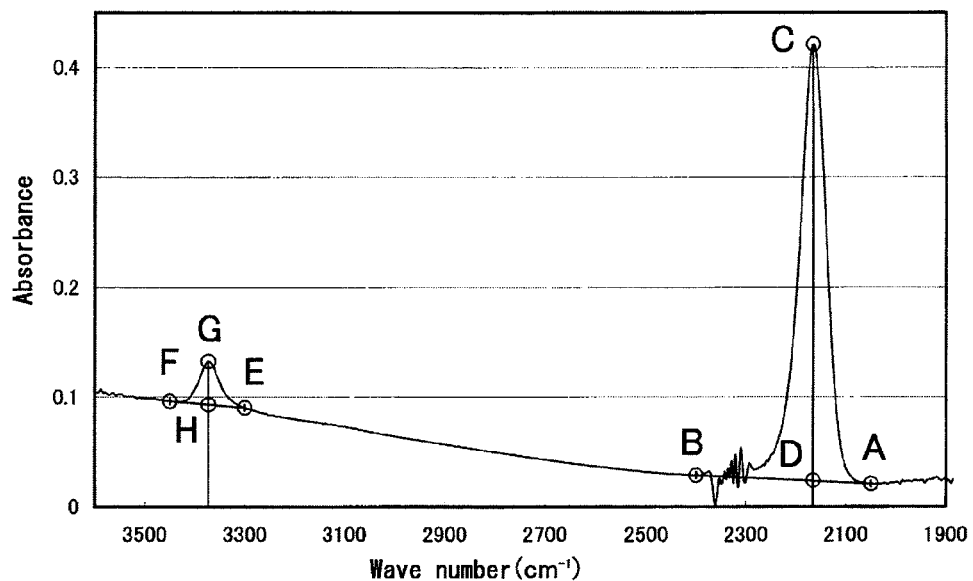
FIG. 1 shows the FT-IR spectrum of the inorganic polysilazane according to Example 1.

The coating liquid for forming an insulation film according to the present invention will now be described in detail.

It is essential that the coating liquid for forming an insulation film according to the present invention comprise an inorganic polysilazane whose ratio of a peak area at 4.5 to 5.3 ppm attributed to $SiH_1$ group and $SiH_2$ group with respect to a peak area at 4.3 to 4.5 ppm attributed to $SiH_3$ group in $^1$H-NMR spectrum is 4.2 to 50; and an organic solvent. That is, the coating liquid for forming an insulation film according to the present invention comprises an inorganic polysilazane in which, when the peak area at 4.3 to 4.5 ppm attributed to $SiH_3$ group is defined as (A) and the peak area at 4.5 to 5.3 ppm attributed to $SiH_1$ group and $SiH_2$ group is defined as (B), (B)/(A)=4.2 to 50; and an organic solvent.

Here, the inorganic polysilazane refers to a polysilazane which does not contain an organic group in the molecule, and examples of the above-described organic group include hydrocarbon group, ether group, ester group and alkoxyl group.

The inorganic polysilazane used in the coating liquid for forming an insulation film according to the present invention is an organic polysilazane whose ratio of a peak area at 4.5 to 5.3 ppm attributed to $SiH_1$ group and $SiH_2$ group with respect to a peak area at 4.3 to 4.5 ppm attributed to $SiH_3$ group (hereinafter, also referred to as "$SiH_3$ ratio") in $^1$H-NMR spectrum is 4.2 to 50. By using such an inorganic polysilazane, the shrinkage in the calcination step in water vapor can be reduced, and in particular, such an inorganic polysilazane is suitably used even when calcination thereof is performed at a temperature of not lower than 500° C. since it hardly causes the resulting film to shrink. When the $SiH_3$ ratio of the inorganic polysilazane is smaller than 4.2, the shrinkage in the calcination step in water vapor becomes large, while when the $SiH_3$ ratio is larger than 50, the storage stability of the coating liquid for forming an insulation film according to the present invention may be impaired. In the present invention, the $SiH_3$ ratio is preferably 4.5 to 45, more preferably 5.0 to 40, most preferably 6.8 to 30.

In $^1$H-NMR spectrum, the proton peak of the $SiH_1$ group and $SiH_2$ group of the inorganic polysilazane and that of the $SiH_3$ group appear as a broad peak at 4.5 to 5.3 ppm and 4.3 to 4.5 ppm, respectively. In $^1$H-NMR spectrum, since peak areas are proportional to the proton content attributed to the respective peak, a small $SiH_3$ ratio indicates that the inorganic polysilazane contains a large amount of $SiH_3$ group and a large $SiH_3$ ratio indicates that the inorganic polysilazane contains a small amount of $SiH_3$ group. In cases where a large amount of $SiH_3$ group is contained in the inorganic polysilazane, for the reasons explained later, it is believed that silane is generated and shrinkage becomes large in the calcination step in water vapor.

In the present invention, the inorganic polysilazane has a mass average molecular weight of preferably 2,000 to 20,000, more preferably 2,500 to 8,000, most preferably 3,000 to 5,000. When the molecular weight of the inorganic polysilazane is too small, the amount of volatile matter or sublimated matter released from the coating film may increase in the drying step or the calcination step, leading to a decrease in thickness of the resulting insulation film or occurrence of cracking, while when the molecular weight is too large, the coating property to a fine pattern may be impaired.

Further, in the present invention, the ratio of a component having a mass average molecular weight of not higher than 800 in the inorganic polysilazane is preferably not higher than 20%, more preferably not higher than 16%, most preferably not higher than 12%. When the inorganic polysilazane contains an excessive amount of a low-molecular weight component, the amount of volatile matter or sublimated matter released from the coating film may increase in the drying step or the calcination step, leading to a decrease in thickness of the resulting insulation film or occurrence of cracking.

In the present invention, the mass average molecular weight refers to one based on polystyrene which is determined by GPC analysis using tetrahydrofuran (THF) as a solvent and a differential refractive index detector (RI detector). Further, the ratio of a component having a mass average molecular weight of not higher than 800 in the inorganic polysilazane refers to, in terms of the peak area ratio of the inorganic polysilazane determined by GPC analysis, a ratio of the amount of polysilazane having a mass average molecular weight of not higher than 800 based on polystyrene with respect to the total polysilazane amount.

In the present invention, the inorganic polysilazane has, in the infrared spectrum thereof, a ratio of the maximum absorbance in the range of 3,300 to 3,450 $cm^{-1}$ to the maximum absorbance in the range of 2,050 to 2,400 $cm^{-1}$ of preferably 0.01 to 0.15, more preferably 0.03 to 0.14, most preferably 0.05 to 0.13. When the ratio of the maximum absorbance in the range of 3,300 to 3,450 $cm^{-1}$ to the maximum absorbance in the range of 2,050 to 2,400 $cm^{-1}$ in the infrared spectrum of the inorganic polysilazane is smaller than 0.01, the storage stability of the coating liquid for forming an insulation film according to the present invention may be impaired, while when the ratio is higher than 0.15, the shrinkage in the calcination step in water vapor may become large.

In the infrared spectrum of the inorganic polysilazane, the absorptions attributed to Si—H bond and N—H bond are at 2,050 to 2,400 $cm^{-1}$ and 3,300 to 3,450 $cm^{-1}$, respectively; therefore, a small NH/SiH absorbance ratio indicates that the ratio of the number of H atom of the N—H bond to that of the Si—H bond is small as compared to a case of a large NH/SiH absorbance ratio. In cases where inorganic polysilazanes have an identical nitrogen content ratio with respect to the silicon content, it is believed that the one having a smaller NH/SiH absorbance ratio has a greater number of ring structures in the molecule and that this affects the storage stability of the coating liquid for forming an insulation film and the shrinkage in the calcination step in water vapor.

The infrared spectrum of the inorganic polysilazane may be measured by either a transmission method or a reflection method; however, it is preferred that the measurement be performed by a transmission method since the measured values are consistent. In cases where a transmission method is employed, the infrared spectrum can be measured after coating and drying the coating liquid for forming an insulation film on a test piece which does not substantially interfere with the absorption of the infrared spectrum at 2,050 to 2,400 $cm^{-1}$ and 3,300 to 3,450 $cm^{-1}$. The test piece used in the measurement is not particularly restricted as long as it does not substantially interfere with the absorption of the infrared spectrum at 2,050 to 2,400 $cm^{-1}$ and 3,300 to 3,450 $cm^{-1}$; however, a silicon wafer whose both surfaces are polished is preferred since a uniform film can be formed thereon using an existing coating apparatus such as a spin coater. The drying after the application of the coating liquid for forming an insulation film on such a test piece can be performed under any conditions as long as the organic solvent in the coating liquid for forming an insulation film can be sufficiently removed, and for example, the drying is performed by heating the coated test piece at 150° C. for not less than 1 minute, preferably at 150° C. for about 3 minutes. The NH/SiH absorbance ratio can be obtained with good accuracy when the thickness of the inorganic polysilazane film formed on the test piece is 500 to 1,000 nm. For the measurement of the infrared spectrum, it is preferred to use a Fourier transform infrared spectrophotometer (FT-IR) from the standpoint of the easiness in the data processing after the measurement.

Here, the NH/SiH absorbance ratio is a value obtained by a peak-intensity method from the infrared spectrum chart of the inorganic polysilazane. FIG. 1 is an example of FT-IR spectrum of an inorganic polysilazane which can be suitably used in the present invention. In FIG. 1, points A, B, E and F are assigned on the absorbance curve at 2,050 $cm^{-1}$, 2,400 $cm^{-1}$, 3,300 $cm^{-1}$ and 3,450 $cm^{-1}$, respectively, and points C and G are assigned on the absorbance curve at the wave-numbers where the maximum absorbance is obtained in the range of 2,050 to 2,400 $cm^{-1}$ and 3,300 to 3,450 $cm^{-1}$, respectively. When point D is defined as the intersection between the line perpendicularly drawn from the point C to the baseline (the line where the absorbance is 0; blank) and the line AB and point H is defined as the intersection of the line perpendicularly drawn from the point G to the baseline and the line EF, the NH/SiH absorbance ratio corresponds to the ratio of the segment GH to the segment CD. That is, the NH/SiH absorbance ratio according to the present invention is, in the infrared spectrum chart of the inorganic polysilazane, the ratio of the maximum absorbance value in the range of 3,300 to 3,450 $cm^{-1}$ having the line connecting the absorbance values at 3,300 $cm^{-1}$ and 3,450 $cm^{-1}$ as baseline with respect to the maximum absorbance value in the range of 2,050 to 2,400 $cm^{-1}$ having the line connecting the absorbance values at 2,050 $cm^{-1}$ and 2,400 $cm^{-1}$ as baseline. It is noted here that, usually, an inorganic silazane has the maximum absorbance at about 2,166 $cm^{-1}$ in the range of 2,050 to 2,400 $cm^{-1}$ and at about 3,377 $cm^{-1}$ in the range of 3,300 to 3,450 $cm^{-1}$.

Further, in the present invention, the refractive index of the inorganic polysilazane at a wavelength of 633 nm is preferably 1.550 to 1.650, more preferably 1.560 to 1.640, still more preferably 1.570 to 1.630. When the refractive index of the inorganic polysilazane used in the coating liquid for forming an insulation film at a wavelength of 633 nm is smaller than 1.550, the shrinkage in the calcination step in water vapor may become large, while when it is greater than 1.650, the storage stability of the coating liquid for forming an insulation film according to the present invention may be impaired.

The refractive index of the inorganic polysilazane at a wavelength of 633 nm is measured after sufficiently remove the organic solvent in the coating liquid for forming an insulation film. For example, in cases where the measurement is performed by forming an inorganic polysilazane film on a test piece, the coating liquid for forming an insulation film is coated on the test piece by spin coating method, dip coating method, knife coating method, roll coating method or the like, and the resultant is then dried to form an inorganic polysilazane film. The drying conditions vary depending on the thickness of the inorganic polysilazane film; however, when the film thickness is 500 to 1,000 nm, the drying is performed by heating the coated test piece at 150° C. for 1 minute, preferably at 150° C. for about 3 minutes.

In cases where inorganic polysilazanes have an identical nitrogen content ratio with respect to the silicon content, it is believed that the one having a higher refractive index has a smaller hydrogen content and a greater number of ring structures in the molecule and that this affects the storage stability of the coating liquid for forming an insulation film and the shrinkage in the calcination step in water vapor.

The organic solvent of the coating liquid for forming an insulation film according to the present invention is not particularly restricted as long as it is one which is not reactive with the inorganic polysilazane. Since hydroxyl group, aldehyde group, ketone group, carboxyl group, ester group and the like have reactivity with an inorganic polysilazane, a solvent comprising these groups is not preferred as the organic solvent of the coating liquid for forming an insulation film according to the present invention. Examples of preferred organic solvent include saturated chain hydrocarbon compounds such as pentane, hexane, heptane, octane, 2,2,4-trimethylpentane (also referred to as isooctane), isononane and 2,2,4,6,6-pentamethylheptane (also referred to as isododecane); saturated cyclic hydrocarbon compounds such as cyclopentane, cyclohexane, methylcyclohexane and decalin; aromatic hydrocarbon compounds such as benzene, toluene, xylene, ethylbenzene, cumene, pseudocumene and tetralin; and ether compounds such as diethyl ether, dipropyl ether, diisopropyl ether, dibutyl ether, diisobutyl ether, t-butylmethyl ether, tetrahydrofuran, dioxane and 1,2-dimethoxyethane. There among, xylene and dibutyl ether are preferred since they have good film-forming property, and dibutyl ether is more preferred since it has good storage stability. The above-described organic solvents may be used individually, or two or more thereof may be used in combination for the purpose of, for example, adjusting the evaporation rate.

Figure 2:
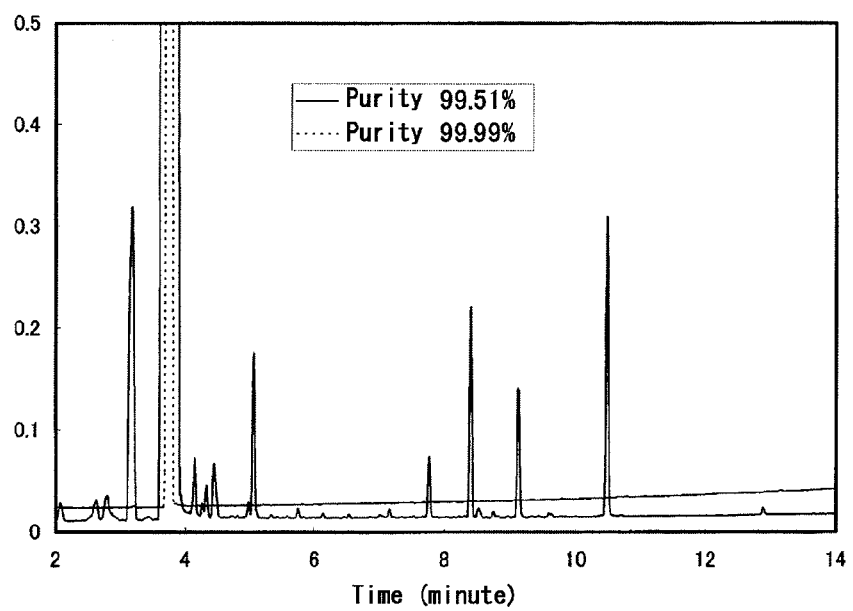
FIG. 2 shows gas chromatographic charts of dibutyl ether having a purity of 99.99% and dibutyl ether having a purity of 99.51%.

Among the organic solvents, in ether compounds, an alcohol compound, aldehyde compound, ketone compound, carboxylic acid compound and ester compound and the like are contained as starting material, by-product in the production step or deterioration product generated during storage. When the organic solvent of the coating liquid for forming an insulation film according to the present invention contains these compounds, shrinkage in the calcination step may be increased. Therefore, in the present invention, it is preferred that the total content of the alcohol compound, aldehyde compound, ketone compound, carboxylic acid compound and ester compound in the organic solvent be not higher than 0.1% by mass. For example, when the organic solvent of the coating liquid for forming an insulation film according to the present invention contains dibutyl ether, the total content of the alcohol compound, aldehyde compound, ketone compound, carboxylic acid compound and ester compound in the organic solvent is preferably not higher than 0.1% by mass, more preferably not higher than 0.05% by mass, most preferably not higher than 0.01% by mass, with respect to dibutyl ether. It is noted here that the alcohol compound, aldehyde compound, ketone compound, carboxylic acid compound and ester compound in the organic solvent can be quantified by, for example, gas chromatography analysis. FIG. 2 shows gas chromatographic charts of dibutyl ether having a purity of 99.99% and dibutyl ether having a purity of 99.51%.

The inorganic polysilazane content in the coating liquid for forming an insulation film according to the present invention is preferably 5 to 40% by mass, more preferably 10 to 35% by mass, most preferably 15 to 30% by mass. When the inorganic polysilazane content in the coating liquid for forming an insulation film according to the present invention is too low, the insulation film-forming property may not be sufficient, while when the content is too high, the storage stability of the coating liquid for forming an insulation film according to the present invention may not be sufficient, which results in generation of a gel matter.

The inorganic polysilazane used in the present invention may be any inorganic polysilazane produced by a conventionally known method as long as it has a $SiH_3$ ratio of 4.2 to 50. However, it is preferred that the inorganic polysilazane used in the present invention be one produced by a method of producing an inorganic polysilazane in which an adduct is formed by reacting a halosilane compound with a base and the resulting adduct is then reacted with ammonia, the method comprising the step of reacting ammonia in a solution or dispersion of the adduct at a temperature of −50 to −1° C., since such an inorganic polysilazane having a $SiH_3$ ratio of 4.2 to 50 is stably obtained and the storage stability of the coating liquid for forming an insulation film obtained by blending an organic solvent is also good.

As the reaction between a halosilane compound and ammonia is an abrupt exothermic reaction, in order to control the reaction, there is known an inorganic polysilazane production method in which an adduct of a halosilane compound and a base (hereinafter, also referred to as "adduct") is formed first and the resulting adduct is then reacted with ammonia (hereinafter, also referred to as "adduct method") (for example, see Japanese Unexamined Patent Application Publication No. S60-145903 and Japanese Unexamined Patent Application Publication No. S61-174108). The reaction heat in the reaction with ammonia can be easily controlled by such adduct method; however, in a conventional adduct method, such an inorganic polysilazane having a $SiH_3$ ratio of 4.2 to 50 cannot be stably obtained. This is because, in a conventional adduct method, an adduct and ammonia react at not lower than ice-cold temperature or 0° C. and the reaction temperature presumably becomes not lower than 0° C. due to the reaction heat even when the reaction is performed at an ice-cold temperature; however, when an adduct and ammonia are reacted at a temperature of not lower than 0° C., the content of $SiH_3$ group in the resulting inorganic polysilazane is increased.

That is, in the reaction to produce an inorganic polysilazane from a halosilane compound and ammonia, the reaction mechanism by which a $SiH_3$ group and branched structure are formed has not been sufficiently clarified; however, in Japanese Unexamined Patent Application Publication No. H1-138108, generation of a branched structure by a polycondensation reaction represented by the following reaction formula (3):

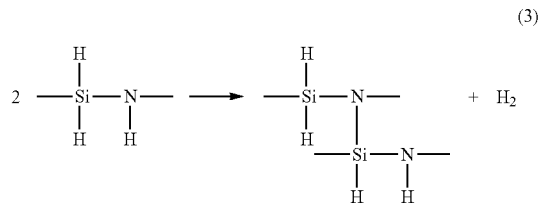

(3)

and generation of a $SiH_3$ group by a ring-opening reaction of cyclic silazane which is represented by the following reaction formula (4):

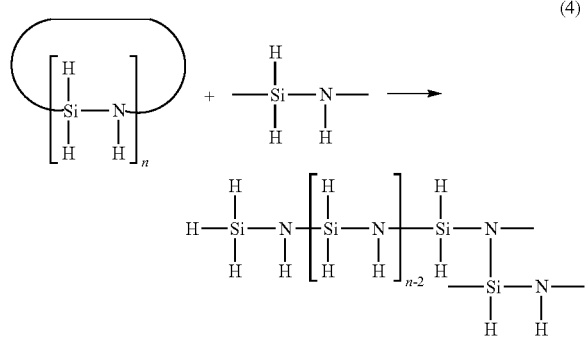

(4)

are suggested. Yet, the amount of $SiH_3$ group contained in an actual inorganic polysilazane is greater than expected from the reaction formula (4), and the present inventors thus thought that the reason for this is because, although the halosilane compound and base bind to form an adduct, the bond therebetween is not strong and the halosilane compound and base are in a liberated, equilibrium condition in the solvent, so that the reaction of the liberated halosilane compound with ammonia is not uniform. For instance, it was thought that an adduct of dichlorosilane and pyridine is in an equilibrium condition represented by the following reaction formula (5):

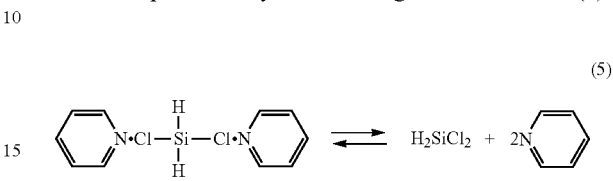

(5)

and the liberated dichlorosilane undergoes, in addition to a reaction with ammonia, a disproportionation reaction represented by the following reaction formula (6):

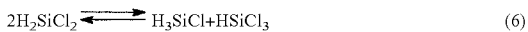

(6)

to generate monochlorosilane and trichlorosilane; and that the $SiH_3$ group and $SiH_1$ group are generated from the monohalosilane compound and trihalosilane compound, respectively.

Based on such view, the present inventors discovered that an inorganic polysilazane having a $SiH_3$ ratio of 4.2 to 50 can be stably obtained by controlling the temperature of the reaction between the adduct and ammonia at −50 to −1° C. so as to inhibit the disproportionation reaction represented by the reaction formula (6). When the temperature is lower than −50° C., the rate of the reaction between the adduct and ammonia is slow, making the time required for the production too long, while when the temperature is higher than −1° C., the content of $SiH_3$ group in the inorganic polysilazane is increased. Therefore, the temperature of the reaction between the adduct and ammonia is preferably −40 to −3° C., more preferably −35 to −5° C., most preferably −30 to −10° C.

Examples of the halosilane compound used in the inorganic polysilazane according to the present invention include dihalosilane compounds such as dichlorosilane, dibromosilane and chlorobromosilane; and trihalosilane compounds such as trichlorosilane, tribromosilane, dichlorobromosilane and chlorodibromosilane, and from the standpoint of industrial availability, dichlorosilane and trichlorosilane are preferred. The above-described halosilane compounds may be used individually, or two or more thereof may be used in combination. An inorganic polysilazane using a dihalosilane compound has excellent film-forming property and an inorganic polysilazane using a trihalosilane compound has an advantage in that shrinkage at the time of sintering is small.

Here, it is preferred that a dihalosilane compound and a trihalosilane compound be used in combination since it allows an inorganic polysilazane having a film-forming property and a small shrinkage at the time of sintering to be produced. As for the ratio of the dihalosilane compound and trihalosilane compound, the trihalosilane compound is used in an amount of preferably 0.01 to 2 mol, more preferably 0.03 to 1 mol, most preferably 0.05 to 0.5 mol, with respect to 1 mol of the dihalosilane compound.

The base used in the adduct formation may be any base as long as it does not undergo any reaction other than the adduct-forming reaction with the halosilane compound. Examples of such base include tertiary amines such as trimethylamine, triethylamine, tributylamine and dimethylaniline; and pyridines such as pyridine and picoline, and from the standpoints of industrial availability and easiness of handling, pyridine and picoline are preferred and pyridine is more preferred. The base may be used in any amount as long as it is not less than one time by mole with respect to the halogen atom of the halosilane compound; however, in order to attain sufficient adduct formation, it is preferably not less than 1.2 times by mole.

Since adduct formation leads to a decrease in the fluidity, it is preferred that the adduct-forming reaction be carried out in a solvent. The solvent for the adduct-forming reaction may be any of those solvents exemplified for the organic solvent of the coating liquid for forming an insulation film according to the present invention; however, it is also possible to use the base for the adduct formation in an excessive amount to utilize the excess base as the solvent. It is particularly preferred to use an excess amount of pyridine without using any other solvent in such a manner that the fluidity can be maintained even after the completion of the adduct-forming reaction. In this case, the amount of pyridine used is preferably 3 to 30 times by mole, more preferably 4 to 25 times by mole, still more preferably 5 to 20 times by mole, with respect to the halosilane compound.

Further, in order to prevent a decrease in the fluidity due to adduct formation, the halosilane compound and ammonia may be added in fractions or they may be added continuously at the same time.

In the reaction between the adduct and ammonia, from the standpoint of stoichiometry, the amount of ammonia used may be any amount as long as it is not less than the equimolar amount (not less than one time by mole) with respect to the halogen atom of the halosilane compound used in the reaction; however, taking the sufficient amount required for completing the reaction and the economical efficiency into consideration, the amount of ammonia used is preferably 1.0 to 3.0 times by mole, more preferably 1.1 to 2.5 times by mole, most preferably 1.2 to 2.0 times by mole, with respect to the halogen atom of the halosilane compound used in the reaction.

After the reaction with ammonia, excess ammonia is removed as required and the thus generated salts such as ammonium chloride are removed by filtration or the like. Then, by substituting the solvent with the above-described organic solvent in accordance with a known method as required, the coating liquid for forming an insulation film according to the present invention can be obtained.

Before or after the removal of the generated salts, by allowing the SiH group and NH group to react to form a Si—N bond, the coating liquid for forming an insulation film according to the present invention, inorganic polysilazane, may also be made into, for example, a cyclic form by intramolecular reaction or a high-molecular-weight form by intermolecular reaction. By this, a decrease in the $SiH_3$ group, an increase in the mass average molecular weight, a decrease in the component having a mass average molecular weight of not higher than 800, an increase in the NH/SiH absorbance ratio, an increase in the refractive index and the like are attained. Examples of a method of forming a Si—N bond by allowing the SiH group and NH group of the inorganic polysilazane include a method in which heating is performed in a basic solvent such as pyridine or picoline (for example, see Japanese Unexamined Patent Application Publication No. H1-138108); a method in which a basic catalyst containing an alkali metal such as alkali metal hydride, alkali metal alkoxide or anhydrous alkali metal hydride is used (for example, see Japanese Unexamined Patent Application Publication No. S60-226890); a method in which a quaternary ammonium compound such as tetramethylammonium hydroxide is used as a catalyst (for example, see Japanese Unexamined Patent Application Publication No. H5-170914); and a method in which an acid catalyst such as ammonium nitrate or ammonium acetate is used (for example, see Japanese Unexamined Patent Application Publication No. 2003-514822), and from the standpoint of the easiness of removing the basic solvent or catalyst used in the reaction, a method in which heating is performed in a basic solvent is preferred. In cases where the inorganic polysilazane is produced by an adduct method, since the adduct reacts with ammonia to liberate a base, the thus liberated base can be used as a basic solvent. Therefore, from the standpoints of effective utilization of the starting material and simplification of the production steps, it is preferred that, after producing the inorganic polysilazane by an adduct method, heating of the inorganic polysilazane be performed using the liberated base as a basic solvent to allow the SiH group and NH group thereof to react to form a Si—N bond.

The coating liquid for forming an insulation film according to the present invention may further comprise, as required, other components such as a filler, pigment, dye, leveling agent, UV inhibitor, antifoaming agent, antistatic agent, dispersing agent and curing accelerator.

The coating liquid for forming an insulation film according to the present invention can be used in those applications where polysilazane is conventionally used, such as insulation films of semiconductor devices, protective films of flat-panel displays and anti-reflection films of optics-related products, and it can be particularly suitably used for an insulation film of a semiconductor device.

When forming an insulation film, it is preferred to employ a production method which comprises the steps of coating the coating liquid for forming an insulation film according to the present invention on a subject material to form a coating film; drying the thus formed coating film to remove organic solvent therefrom; and calcinating the resultant in water vapor to form a silica insulation film.

The method of coating the coating liquid for forming an insulation film according to the present invention on a subject material is not particularly restricted and it may be any coating method such as spray method, spin coating method, dip coating method, roll coating method, flow coating method, screen printing method or transfer printing method; however, a spray coating method is preferred since a coating film which is thin and uniform can be formed.

The drying temperature and time in the drying step vary depending on the organic solvent used and the coating film thickness; however, the heating is performed at a temperature of 80 to 200° C., preferably 120 to 170° C., for 1 to 30 minutes, preferably 2 to 10 minutes. The drying may be performed in any of the following atmospheres: oxygen, air and inert gas.

The calcination step is performed in water vapor atmosphere having a relative humidity of 20 to 100% at a temperature of 200 to 1,200° C. At a low calcination temperature, the reaction may not sufficiently proceed and there is a concern of degradation in the insulation properties due to the residual silanol group, while at a high calcination temperature, there is a problem in the production cost. Therefore, the calcination in water vapor atmosphere is performed at a temperature of preferably 300 to 1,000° C., more preferably 700 to 900° C. When calcination is performed, it may be done in one step at a temperature of not lower than 700° C., or in two steps where calcination is performed at 200 to 500° C., preferably 300 to 450° C., for 30 to 60 minutes and then at 450 to 1,200° C., preferably 600 to 1,000° C., more preferably 700 to 900° C. Such two-step calcination is preferred since the shrinkage of the insulation film is small and cracking is not likely to occur. In addition to the above, a low-temperature calcination method in which a 30 to 60-minute calcination at 200 to 500° C., preferably 350 to 450° C., is followed by immersion in distilled water at 20 to 80° C. (for example, see Japanese Unexamined Patent Application Publication No. H7-223867) may also be employed; however, in such low-temperature calcination method, since degradation occurs in the insulation properties due to the residual silanol group, it is preferred that heating be performed in the air at 700 to 900° C. for about 5 to 60 minutes after the low-temperature calcination.

EXAMPLES

The present invention will now be described concretely by way of examples thereof; however, the scope of the present invention is not restricted thereto. It is noted here that the units "parts" and "%" in the following examples are based on mass.

Example 1

To a 5,000-ml glass reaction vessel equipped with a stirrer, a thermometer and an introduction tube, 4,300 g (54.4 mol) of dry pyridine was loaded under nitrogen atmosphere, and with stirring, 545 g (5.4 mol) of dichlorosilane was fed via the introduction tube at a reaction temperature of −40 to −30° C. over a period of 1 hour to produce a pyridine adduct of dichlorosilane. Then, 325 g (19.1 mol) of ammonia was fed via the introduction tube at a reaction temperature of −40 to −30° C. over a period of 1 hour, and the resultant was further stirred at −20 to −15° C. for 2 hours to complete the reaction.

After heating the reaction solution to 25° C., the thus produced ammonium chloride was filtered under nitrogen atmosphere and excess ammonia was removed under reduced pressure. Then, the solvent was changed from pyridine to dibutyl ether by a conventional method, and the resultant was further filtered under argon gas atmosphere using a PTFE cartridge filter having a filtration size of 0.1 μm to obtain a coating liquid for forming an insulation film according to Example 1 having an inorganic polysilazane content of 19.0%.

Here, as the dibutyl ether used as the solvent, one having a purity of 99.99% and a total content of alcohol compound, aldehyde compound, ketone compound, carboxylic acid compound and ester compound of not higher than 0.01% was employed.

Example 2

The same operations as in Example 1 were performed, except that the ammonia reaction temperature of −40 to −30° C. was changed to −15 to −12° C. and that the subsequent stirring was performed at −15 to −12° C. for 2 hours, to obtain a coating liquid for forming an insulation film according to Example 2 having an inorganic polysilazane content of 19.1%.

Example 3

The same operations as in Example 2 were performed, except that, in Example 1, a mixture of 444 g (4.4 mol) of dichlorosilane and 13.6 g (1.0 mol) of trichlorosilane was used in place of 545 g (5.4 mol) of dichlorosilane and that the amount of ammonia was increased from 325 g (19.1 mol) to 340 g (20.0 mol), to obtain a coating liquid for forming an insulation film according to Example 3 having an inorganic polysilazane content of 19.2%.

Comparative Example 1

The same operations as in Example 1 were performed, except that the ammonia reaction temperature of −40 to −30° C. was changed to 0 to 5° C. and that the subsequent stirring was performed at 0 to 5° C. for 2 hours, to obtain a coating liquid for forming an insulation film according to Comparative Example 1.

Comparative Example 2

To the same reaction vessel used in Example 1, 550 g (5.4 mol) of dichlorosilane and, as a solvent, 3,200 g of dibutyl ether having a purity of 99.51% were loaded under nitrogen atmosphere, and 324 g (19.1 mol) of ammonia was fed via the introduction tube over a period of 1 hour while cooling the resultant in such a manner to attain a reaction temperature of −20 to −15° C. The resultant was further stirred at −20 to −15° C. for 2 hours to complete the reaction.

Thereafter, the thus produced ammonium chloride was removed by filtration under nitrogen atmosphere and excess ammonia was removed under reduced pressure to obtain a coating liquid for forming an insulation film according to Comparative Example 2 having an inorganic polysilazane content of 19.0%.

Here, in the dibutyl ether having a purity of 99.51%, the total content of alcohol compound, aldehyde compound, ketone compound, carboxylic acid compound and ester compound was 0.46%.

Comparative Example 3

The same operations as in Example 1 were performed, except that, in Comparative Example 1, the reaction temperature of dichlorosilane and pyridine was changed from −40 to −30° C. to 0 to 5° C. and that the amount of ammonia was changed from 325 g (19.1 mol) to 374 g (22 mol), to obtain a coating liquid for forming an insulation film according to Comparative Example 3.

Comparative Example 4

In accordance with the example according to Japanese Unexamined Patent Application Publication No. H1-138108, to a 5,000-ml glass reaction vessel equipped with a stirrer, a thermometer and an introduction tube, 2,750 g (about 2,800 ml, 34.8 mol) of dry pyridine was loaded under nitrogen atmosphere and ice-cooled. Then, after adding 516 g (5.1 mol) of dichlorosilane to produce a pyridine adduct, 300 g (17.6 mol) of ammonia was fed with stirring via the introduction tube at a temperature of 0 to 5° C. over a period of 1 hour. The resultant was further stirred for 2 hours with ice cooling to complete the reaction. After completion of the reaction, excess ammonia was removed, and the reaction mixture was then centrifuged and washed with dry pyridine to obtain 5,200 g of a filtrate containing an inorganic silazane. The thus obtained filtrate containing an inorganic silazane was placed in a 5,000-ml pressure-resistant reaction vessel in an amount of 2,000 g and allowed to react at 150° C. for 3 hours with stirring. Then, the solvent was changed from pyridine to dibutyl ether by a conventional method, and the resultant was further filtered under argon gas atmosphere using a PTFE cartridge filter having a filtration size of 0.1 μm to obtain a coating liquid for forming an insulation film according to Comparative Example 4 having an inorganic polysilazane content of 19.0%. Here, the dibutyl ether was the same as the one used in Example.

<Analysis of Coating Liquid: $^1$H-NMR Analysis and GPC Analysis>

Figure 3:
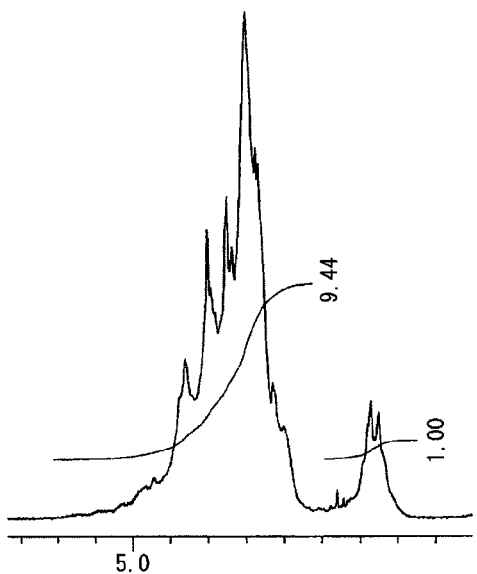
FIG. 3 shows the $^1H$-NMR spectrum of the inorganic polysilazane according to Example 1.
Figure 4:
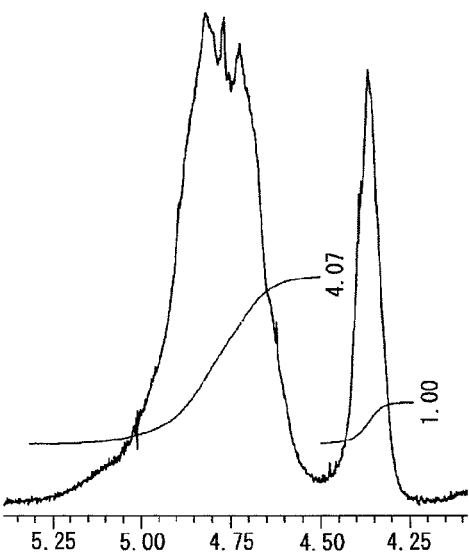
FIG. 4 shows the $^1H$-NMR spectrum of the inorganic polysilazane according to Comparative Example 1.

For the thus obtained coating liquids for forming an insulation film according to Examples 1 to 3 and Comparative Examples 1 to 4, $^1$H-NMR and GPC measurements were carried out. From the result of the $^1$H-NMR measurement, the $SiH_3$ ratio was calculated, and from the GPC result, the mass average molecular weight of the inorganic polysilazane and the content of a component having a mass average molecular weight of not higher than 800 in the inorganic polysilazane were calculated. The $^1$H-NMR was measured at 600 MHz by an FT-NMR apparatus (manufactured by JEOL Ltd.; model JNM-ECA600) using deuterated chloroform ($CDCl_3$) as the solvent. The results thereof are shown in Table 1. It is noted here that FIG. 3 shows the $^1$H-NMR spectrum of the inorganic polysilazane used in Example 1 (the scale is 0.1 ppm/division) and that FIG. 4 shows the $^1$H-NMR spectrum of the inorganic polysilazane used in Comparative Example 1 (the scale is 0.05 ppm/division).

<Analysis of Inorganic Silazane Coating Film: Film Thickness, IR Analysis and Refractive Index>

Each of the thus obtained coating liquids for forming an insulation film according to Examples 1 to 3 and Comparative Examples 1 to 4 was spin-coated on a 4-inch silicon wafer whose both surfaces were polished at an inorganic silazane film thickness after drying of 580 to 620 nm. Then, the resultant was dried at 150° for 3 minutes to prepare a silicon wafer having an inorganic silazane coating film, and the thus obtained silicon wafer was subjected to measurements of the coating film thickness, FT-IR and refractive index at a wavelength of 633 nm. In the FT-IR measurement, a silicon wafer whose both surfaces were polished was used as a reference. Further, the film thickness and refractive index were measured using a prism coupler (model 2010) manufactured by Metricon Corporation. The refractive index at a wavelength of 633 nm and the NH/SiH absorbance ratio calculated from the result of FT-IR measurement are shown in Table 1. It is noted here that FIG. 1 shows the FT-IR spectrum of the inorganic polysilazane according to Example 1.

faces were polished at an inorganic silazane film thickness after drying of 900 to 1,000 nm. Then, the resultant was dried at 150° for 3 minutes to prepare a silicon wafer having an inorganic silazane coating film, and the thus obtained silicon wafer was calcinated in an oven at a relative humidity of 90% and a temperature of 300° C. for 30 minutes as a first calcination. The resultant was then calcinated in an oven at a relative humidity of 60% and a temperature of 500° C. for 30 minutes as a second calcination, and immediately thereafter, the resulting silicon wafer was quenched from 500° C. to 25° C. by transferring it to a 25° C. thermostat bath. For the thus quenched silica insulation film, the existence of cracks was observed visually or under a light microscope (magnification: ×100) to evaluate the crack resistance based on the following criteria. Further, the crack resistance was evaluated in the same manner also for those silicon insulation films of the same thickness which were obtained by changing the conditions of the second calcination to: in an oven at a relative humidity of 60% and a temperature of 700° C. for 30 minutes; or in an oven at a relative humidity of 60% and a temperature of 900° C. for 30 minutes. The results are shown in Table 2.

◯: No crack was confirmed by visual observation and observation under a light microscope.

Δ: No crack was confirmed by visual observation; however, a crack was observed under a microscope.

X: A crack was confirmed by visual observation.

TABLE 1

| | $SiH_3$ ratio | Mass average molecular weight | Content of a component having a mass average molecular weight of not higher than 800 (%) | NH/SiH absorbance ratio | Refractive index |
|---|---|---|---|---|---|
| Example 1 | 9.4 | 3200 | 11.6 | 0.099 | 1.591 |
| Example 2 | 6.2 | 3600 | 10.5 | 0.13 | 1.574 |
| Example 3 | 27.4 | 4400 | 9.2 | 0.11 | 1.621 |
| Comparative Example 1 | 4.1 | 3800 | 11.2 | 0.13 | 1.560 |
| Comparative Example 2 | 4.0 | 3800 | 10.8 | 0.13 | 1.571 |
| Comparative Example 3 | 2.7 | 3200 | 12.3 | 0.15 | 1.548 |
| Comparative Example 4 | 3.6 | 1850 | 23.5 | 0.16 | 1.545 |

<Evaluation as Insulation Film>

The respective silicon wafer used in the analysis of the inorganic silazane coating film was calcinated, as a first calcination, in an oven at a relative humidity of 90% and a temperature of 300° C. for 30 minutes, and then as a second calcination, in an oven at a relative humidity of 60% and a temperature of 700° C. for 30 minutes to form a silicon insulation film. The thickness of the resulting insulation film was measured. The ratio of the silica insulation film thickness with respect to the inorganic silazane film thickness after drying was determined as cure shrinkage (%). The results thereof are shown in Table 2.

<Crack Resistance Test>

Each of the coating liquids for forming an insulation film according to Examples 1 to 3 and Comparative Examples 1 to 4 was spin-coated on a 4-inch silicon wafer whose both sur-

TABLE 2

| | Cure shrinkage (%) | Crack resistance | | |
|---|---|---|---|---|
| | Film thickness before calcination (nm) | | | |
| | 580~620 | 900~1000 | | |
| | Temperature of second calcination (° C.) | | | |
| | 700 | 500 | 700 | 900 |
| Example 1 | 8.4 | ◯ | ◯ | ◯ |
| Example 2 | 11.6 | ◯ | ◯ | Δ |
| Example 3 | 9.7 | ◯ | ◯ | ◯ |
| Comparative Example 1 | 16.2 | Δ | Δ | X |
| Comparative Example 2 | 17.1 | X | X | X |
| Comparative Example 3 | 14.3 | Δ | X | X |
| Comparative Example 4 | 21.3 | X | X | X |

From Table 2, it is understood that, since the cure shrinkage is small in Examples 1 to 3, an insulation film which has excellent crack resistance and is not likely to detach can be obtained.

The invention claimed is:

1. A coating liquid for forming an insulation film, which comprises an inorganic polysilazane whose ratio of a peak area at 4.5 to 5.3 ppm attributed to $SiH_1$ group and $SiH_2$ group with respect to a peak area at 4.3 to 4.5 ppm attributed to $SiH_3$ group in $^1$H-NMR spectrum is 4.2 to 50; and an organic solvent wherein the ratio of a component having a mass average molecular weight of not higher than 800 in said inorganic polysilazane is not higher than 20%.

2. The coating liquid for forming an insulation film according to claim 1, wherein said inorganic polysilazane has a mass average molecular weight of 2,000 to 20,000.

3. The coating liquid for forming an insulation film according to claim 1, wherein said inorganic polysilazane has, in an infrared spectrum, a ratio of the maximum absorbance in the range of 3,300 to 3,450 cm$^{-1}$ of 0.01 to 0.15 with respect to the maximum absorbance in the range of 2,050 to 2,400 cm$^{-1}$.

4. The coating liquid for forming an insulation film according to claim 1, wherein said inorganic polysilazane has a refractive index of 1.550 to 1.650 at a wavelength of 633 nm.

5. The coating liquid for forming an insulation film according to claim 1, wherein said inorganic polysilazane is obtained by reacting a dihalosilane compound, a trihalosilane compound or a mixture thereof with a base to form an adduct and then reacting the resulting adduct with ammonia.

6. The coating liquid for forming an insulation film according to claim 1, wherein the total content of alcohol compound, aldehyde compound, ketone compound, carboxylic acid compound and ester compound in said organic solvent is not higher than 0.1% by mass.

7. The coating liquid for forming an insulation film according to claim 1, wherein the content of said inorganic polysilazane is 5 to 40% by mass.

8. An insulation film, which is obtained from the coating liquid for forming an insulation film according to claim 1.

9. The insulation film according to claim 8, which is obtained through calcination at a temperature of not lower than 500° C.

10. A method of producing an inorganic polysilazane, wherein an adduct is formed by reacting a dihalosilane compound, a trihalosilane compound or a mixture thereof with a base and the resulting adduct is then reacted with ammonia, ammonia is allowed to react in a solution or dispersion of said adduct at a temperature of −50 to −1° C.

* * * * *